(12) United States Patent
Tseng et al.

(10) Patent No.: US 9,853,008 B2
(45) Date of Patent: Dec. 26, 2017

(54) CONNECTING TECHNIQUES FOR STACKED CMOS DEVICES

(71) Applicant: Taiwan Semiconductor Manufacturing Co., Ltd., Hsin-Chu (TW)

(72) Inventors: Hsiang-Jen Tseng, Hsinchu (TW); Wei-Yu Chen, Hsinchu (TW); Ting-Wei Chiang, New Taipei (TW); Li-Chun Tien, Tainan (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/219,357

(22) Filed: Jul. 26, 2016

(65) Prior Publication Data

US 2016/0336289 A1 Nov. 17, 2016

Related U.S. Application Data

(63) Continuation of application No. 14/102,548, filed on Dec. 11, 2013, now Pat. No. 9,443,758.

(51) Int. Cl.
*H01L 23/00* (2006.01)
*H01L 25/065* (2006.01)
(Continued)

(52) U.S. Cl.
CPC ............ *H01L 24/25* (2013.01); *H01L 21/743* (2013.01); *H01L 21/76838* (2013.01);
(Continued)

(58) Field of Classification Search
CPC ..... H01L 25/0657; H01L 24/48; H01L 24/73; H01L 24/29; H01L 24/32; H01L 23/481; H01L 24/83
See application file for complete search history.

(56) References Cited

U.S. PATENT DOCUMENTS

| 7,368,788 B2 | 5/2008 | Huo et al. |
| 7,528,494 B2 | 5/2009 | Furukawa et al. |

(Continued)

OTHER PUBLICATIONS

Non-Final Office Action dated Apr. 3, 2015 for U.S. Appl. No. 14/102,548.

(Continued)

*Primary Examiner* — Ngan Ngo
(74) *Attorney, Agent, or Firm* — Eschweiler & Potashnik, LLC

(57) ABSTRACT

In some embodiments, the present disclosure relates to an integrated chip having an inter-tier interconnecting structure having horizontal components, which is arranged within a semiconductor substrate and configured to electrically couple a first device tier to a second device tier. The integrated chip has a first device tier with a first semiconductor substrate. A first inter-tier interconnecting structure is disposed inside the first semiconductor substrate. The first inter-tier interconnecting structure has a first segment extending in a first direction and a second segment protruding outward from a sidewall of the first segment in a second direction substantially perpendicular to the first direction. A second device tier is electrically coupled to the first device tier by the first inter-tier interconnecting structure.

20 Claims, 7 Drawing Sheets

(51) Int. Cl.

| | | |
|---|---|---|
| *H01L 23/528* | (2006.01) | |
| *H01L 25/00* | (2006.01) | |
| *H01L 21/768* | (2006.01) | |
| *H01L 23/48* | (2006.01) | |
| *H01L 21/822* | (2006.01) | |
| *H01L 27/06* | (2006.01) | |
| *H01L 23/535* | (2006.01) | |
| *H01L 21/74* | (2006.01) | |
| *H01L 23/522* | (2006.01) | |
| *H01L 23/532* | (2006.01) | |

(52) U.S. Cl.
CPC ........ *H01L 21/8221* (2013.01); *H01L 23/481* (2013.01); *H01L 23/528* (2013.01); *H01L 23/535* (2013.01); *H01L 24/29* (2013.01); *H01L 24/32* (2013.01); *H01L 24/48* (2013.01); *H01L 24/73* (2013.01); *H01L 24/83* (2013.01); *H01L 25/0652* (2013.01); *H01L 25/0657* (2013.01); *H01L 25/50* (2013.01); *H01L 27/0688* (2013.01); *H01L 23/522* (2013.01); *H01L 23/53223* (2013.01); *H01L 23/53238* (2013.01); *H01L 23/53252* (2013.01); *H01L 23/53266* (2013.01); *H01L 2225/06527* (2013.01); *H01L 2225/06548* (2013.01); *H01L 2924/00014* (2013.01); *H01L 2924/13091* (2013.01)

(56) References Cited

U.S. PATENT DOCUMENTS

| | | | | |
|---|---|---|---|---|
| 7,944,058 B2* | 5/2011 | Ishihara | ............... | H01L 23/481 257/686 |
| 8,022,524 B2* | 9/2011 | Sato | ............... | H01L 25/0657 257/685 |
| 8,026,612 B2* | 9/2011 | Maebashi | ............ | H01L 21/6835 257/723 |
| 8,138,594 B2* | 3/2012 | Tanaka | ................. | H01L 23/13 257/686 |
| 8,159,058 B2* | 4/2012 | Ishikawa | ............... | H01L 25/105 257/686 |
| 8,183,465 B2* | 5/2012 | Suzuki | ................ | H01L 21/4857 174/250 |
| 8,535,989 B2* | 9/2013 | Sankman | ............ | H01L 21/6835 257/678 |
| 8,536,700 B2* | 9/2013 | Sabatini | ............. | H01L 23/5385 257/724 |
| 8,541,819 B1 | 9/2013 | Or-Bach et al. | | |
| 8,557,632 B1 | 10/2013 | Or-Bach et al. | | |
| 8,558,356 B2* | 10/2013 | Kiwitt | ..................... | H01G 4/40 257/664 |
| 8,563,403 B1 | 10/2013 | Farooq et al. | | |
| 8,618,654 B2* | 12/2013 | Sutardja | ................. | H01L 24/24 257/723 |
| 8,637,995 B2* | 1/2014 | Sadaka | ............. | H01L 21/76254 257/723 |
| 8,749,077 B2* | 6/2014 | Wu | ........................ | H01L 24/97 257/684 |
| 8,780,576 B2* | 7/2014 | Haba | ................. | H01L 23/49827 174/254 |
| 8,810,006 B2* | 8/2014 | Yu | ........................ | H01L 21/486 257/620 |
| 8,952,540 B2* | 2/2015 | Roy | ..................... | H05K 3/4682 257/668 |
| 9,041,211 B2* | 5/2015 | Uchiyama | ............... | H01L 24/24 257/686 |
| 2001/0002727 A1* | 6/2001 | Shiraishi | ............... | H01L 21/563 257/685 |
| 2002/0159242 A1* | 10/2002 | Nakatani | ............... | H01L 21/561 361/760 |
| 2004/0090758 A1* | 5/2004 | Horikawa | ......... | H01L 23/49816 361/782 |
| 2004/0238941 A1* | 12/2004 | Satoh | ................ | H01L 23/49816 257/698 |
| 2005/0104204 A1* | 5/2005 | Kawakubo | .......... | B81C 1/00301 257/724 |
| 2006/0043571 A1 | 3/2006 | Mousa et al. | | |
| 2006/0192282 A1* | 8/2006 | Suwa | ..................... | H01L 23/50 257/723 |
| 2006/0267010 A1* | 11/2006 | Matsubara | ............. | H01L 22/34 257/48 |
| 2007/0018313 A1* | 1/2007 | Gomyo | ................. | H01L 21/568 257/723 |
| 2007/0182000 A1* | 8/2007 | Higashitani | ......... | H01L 21/4857 257/723 |
| 2007/0222065 A1* | 9/2007 | Andry | .................... | H01L 23/544 257/723 |
| 2007/0278670 A1* | 12/2007 | Kimura | ................... | H01L 23/24 257/723 |
| 2009/0050941 A1 | 2/2009 | Yamazaki et al. | | |
| 2009/0142888 A1 | 6/2009 | Tsuchiya | | |
| 2009/0206477 A1 | 8/2009 | Maebashi et al. | | |
| 2011/0155433 A1* | 6/2011 | Funaya | ............. | H01L 23/49827 174/258 |
| 2011/0156026 A1* | 6/2011 | Yamazaki | ......... | H01L 21/02422 257/43 |
| 2011/0156195 A1 | 6/2011 | Tivarus et al. | | |
| 2011/0156197 A1 | 6/2011 | Tivarus et al. | | |
| 2011/0248403 A1 | 10/2011 | Chandrasekaran et al. | | |
| 2012/0032345 A1 | 2/2012 | Strukov et al. | | |
| 2012/0126425 A1 | 5/2012 | Farooq et al. | | |
| 2012/0193719 A1 | 8/2012 | Or-Bach et al. | | |
| 2012/0223436 A1 | 9/2012 | Sekar et al. | | |
| 2012/0228713 A1 | 9/2012 | Chen et al. | | |
| 2012/0267776 A1* | 10/2012 | Nin | ....................... | H01L 23/481 257/737 |
| 2012/0306082 A1 | 12/2012 | Sekar et al. | | |
| 2012/0313227 A1 | 12/2012 | Or-Bach et al. | | |
| 2013/0095580 A1 | 4/2013 | Or-Bach et al. | | |
| 2013/0119548 A1 | 5/2013 | Avouris et al. | | |
| 2013/0120951 A1* | 5/2013 | Zuo | ..................... | H01L 27/0688 361/783 |
| 2013/0122672 A1 | 5/2013 | Or-Bach et al. | | |
| 2014/0021591 A1* | 1/2014 | Sung | ........................ | H01L 23/60 257/659 |
| 2014/0145272 A1 | 5/2014 | Or-Bach et al. | | |
| 2014/0264474 A1 | 9/2014 | Chu et al. | | |
| 2014/0264744 A1 | 9/2014 | Chu et al. | | |

OTHER PUBLICATIONS

Final Office Action dated Aug. 21, 2015 for U.S. Appl. No. 14/102,548.
Non-Final Office Action dated Oct. 28, 2015 for U.S. Appl. No. 14/102,548.
Final Office Action dated Mar. 3, 2016 for U.S. Appl. No. 14/102,548.
Notice of Allowance dated May 11, 2016 for U.S. Appl. No. 14/102,548.

* cited by examiner

CONNECTING TECHNIQUES FOR STACKED CMOS DEVICES

REFERENCE TO RELATED APPLICATION

This Application is a Continuation of U.S. application Ser. No. 14/102,548 filed on Dec. 11, 2013, the contents of which is hereby incorporated by reference in its entirety.

BACKGROUND

A stacked CMOS chip is a kind of integrated circuit having multiple device tiers which are vertically stacked and which share one package. Stacked CMOS chips extend chip structure to three dimensions and increase the number of CMOS devices that can be "squeezed" into a given footprint.

DETAILED DESCRIPTION

Figure 1:
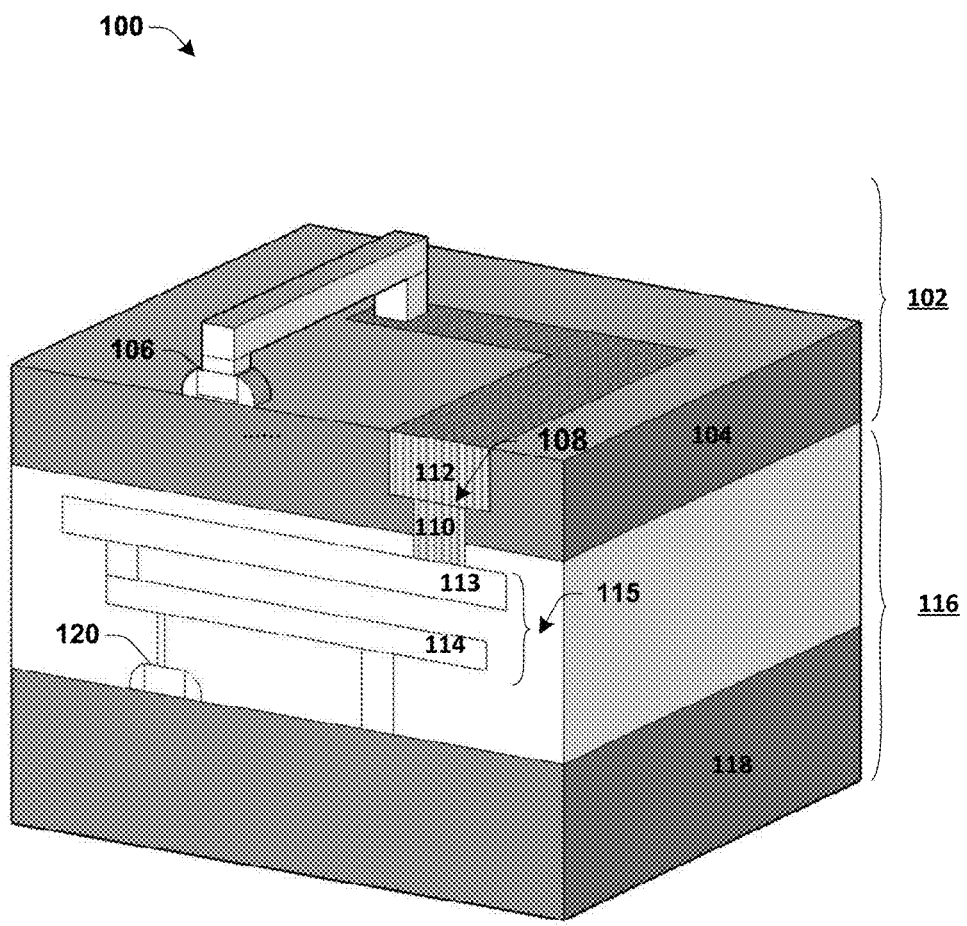
FIG. 1 illustrates a perspective-sectional view of a stacked CMOS device in accordance with some embodiments.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Relative to packaging solutions where multiple chips are arranged in separate horizontally spaced packages, stacked CMOS devices (which include multiple chips that are vertically "stacked" over one another in a single package), shrink the lateral footprint for the circuits when arranged within a product. However, the vertical dimension of stacked CMOS devices can become an issue in some applications. For example, stacked CMOS chips can be too thick for some ultra-thin apparatuses, such as cell phones or portable entertainment units. In addition, forming electrical connections between different vertical device tiers requires alignment of corresponding contact points on the corresponding device tiers, which limits flexibility in structure design. Therefore, in a stacked semiconductor integrated circuit in accordance with some embodiments, instead of connecting multiple tiers solely by a vertical interwafer via, a multi-layer horizontal connecting structure is fabricated inside a substrate of an individual device tier. Individual layers of the multi-layer horizontal connecting structure have different patterns as viewed from above the substrate. Relative to conventional approaches, stacked CMOS devices with multi-layer horizontal connecting structures provide several advantages. For example, locations of electrical contact points of different tiers are flexible, metal usage for electrical path layers is reduced, and the number of and/or thickness of electrical path layers is decreased which tends to "thin down" chip thickness. Power dissipation is also reduced.

FIG. 1 illustrates a perspective-sectional view of a stacked CMOS device 100 in accordance with some embodiments. The stacked CMOS device 100 includes multiple device tiers, such as a first device tier 102 and a second device tier 116. The first device tier 102 comprises a first substrate 104 and a first plurality of devices 106. The second device tier 116 comprises a second substrate 118 and a second plurality of devices 120. A first inter-tier horizontal interconnecting structure 108 is formed at least partially inside the first substrate 104. The first inter-tier horizontal structure 108 electrically connects one or more devices, such as device 106, on the first substrate 104, to one or more devices, such as device 120, on the second substrate 118. The first inter-tier horizontal interconnecting structure 108 can comprises multiple conductive layers, such as metal layers, with different patterns as viewed from above the first substrate.

The first inter-tier horizontal structure 108 includes a first conductive layer 110, which takes the form of a vertical connection element in this example. The first conductive layer 110 is coupled to a second conductive layer 112, which takes the form of a first horizontal layer in this example. The second conductive layer 112, which takes the form of a first horizontal layer in this example, is disposed above the first vertical connection element 110 and is connected to a device of the first plurality of devices 106 or other contact paths on the first device tier 102, for example, power, ground or signal pins. The second conductive layer 112 is electrically coupled to the device of the second device tier 116 by the first vertical connection element 110. The first conductive layer 110 couples the second conductive layer 112 (and hence device 106) to an electrical interconnect structure 115 on the second device tier 116. The electrical interconnect structure 115 has multiple metal layers, such as 113 and 114. These metal layers 113 and 114 are arranged under a back side of the first substrate 104 and are coupled to a device 120 of the second device tier 116. The electrical interconnect structure 115 can also be coupled to other contact points of the second device tier 116 stacked under the first device tier 102. The electrical interconnect structure 115 can either be formed in a dielectric layer between the first tier 102 and the second tier 116 or can be coupled into the second tier 116.

The first plurality of devices 106 on the first substrate 104 and the second plurality of devices 120 on the second substrate 118 can be two dimensional structures (e.g., planar MOSFETs) or three dimensions structures (e.g., silicon on insulator (SOI) devices or FinFET devices). The first inter-tier horizontal interconnecting structure 108 in the first substrate 104 can be copper, silver, tungsten or aluminum with a Ta, Ti, TaN, TiW, TiWN or TiN barrier for preventing metal diffusions. A dielectric layer is formed surrounding the barrier layer for electrical isolation. The first substrate 104 can be either bulk Silicon or epitaxial Silicon on a dielectric material. To further reduce metal material, reduce layers, or decrease complexity of the electrical interconnect structure 115, the first device tier 102 can have devices on both sides. The first device tier 102 can also be "flipped" over relative to what is shown in FIG. 1 so that a top side of the first substrate 104 with the first plurality of devices 106 is proximate to a top side of the second substrate 118 with the second plurality of devices 120. In such way, electrical connections between the first plurality of devices 106 and the second plurality of devices 120 become more flexible. The first device tier 102 can be formed onto the second device tier 116 by deposition, spray coated, curtain coated, or spin coated. The first device tier 102 can also be bonded to the second device tier 116.

Thus, FIG. 1 shows an example of a stacked CMOS device 100 with two device tiers (e.g., 102, 116) connected by a multi-layer inter-tier horizontal interconnecting structure 108 in accordance with some embodiments. Some advantages of this structure include improved placement and routing flexibility and reduced metal usage and further reduction of area and power consumption of the circuit.

Figure 2:
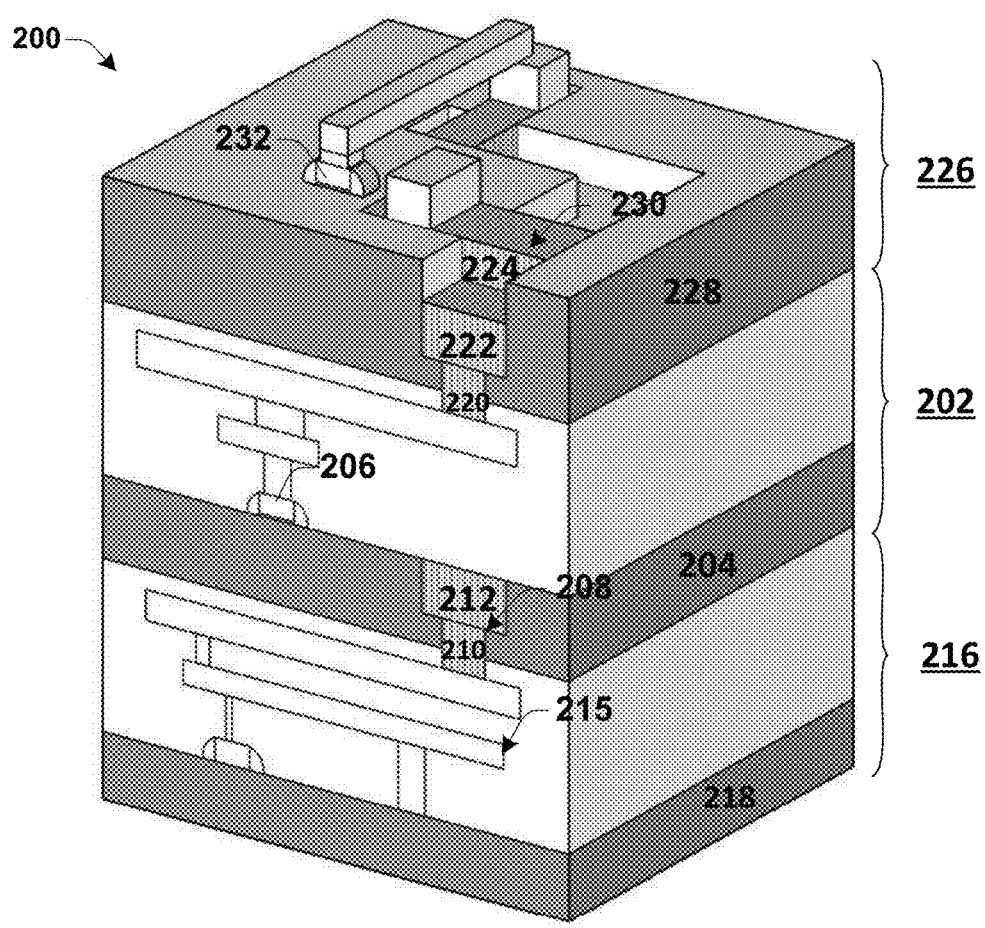
FIG. 2 illustrates a perspective-sectional view of a stacked CMOS device in accordance with some alternative embodiments.
Figure 3:
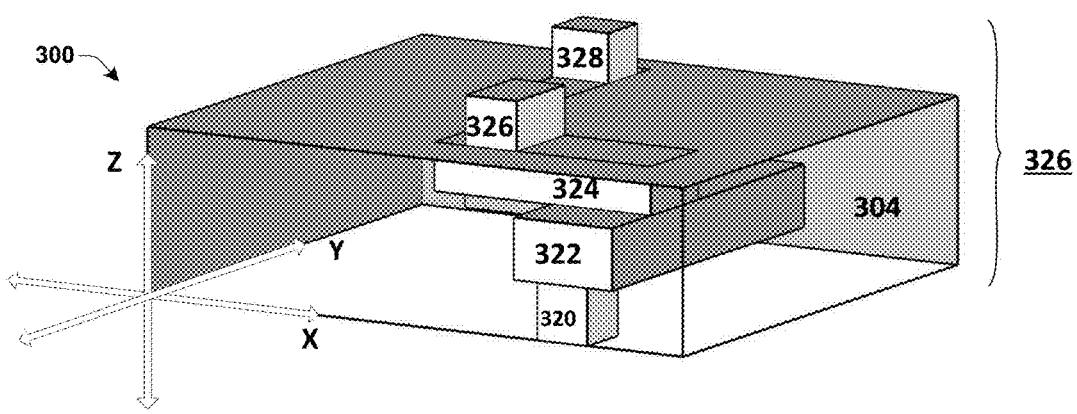
FIG. 3 and FIG. 4 illustrate perspective-sectional views of a three-step structure of a horizontal connecting structure and a four-step structure of a horizontal connecting structure.

FIG. 2 illustrates a perspective-sectional view of a stacked CMOS device 200 in accordance with some alternative embodiments. The stacked CMOS device 200 shows example embodiments of disclosure that a third device tier 226 with a third substrate 228 and a third plurality of devices (e.g., 232) can be stacked onto a first device tier 202 and a second device tier 216 similar to 102 and 116 in FIG. 1. More tiers can be stacked onto the third device tier 226. A second horizontal connecting structure 230 inside the third substrate 218 comprises three layers 220, 222 and 224 and electrically connects the first device tier 202 and the third device tier 226 of which a detailed example perspective-sectional view is shown in FIG. 3. Notably, the first substrate 204 with the first horizontal connecting structure and the third substrate 228 with the second horizontal connecting structure can have similar or different structure. Horizontal connecting structures can have same or different numbers of conductive layers. Patterns of conductive layers can also be different. Thus, FIG. 2 shows another example semiconductor integrated circuit with more than two device tiers connected by multi-layer inter-tier horizontal interconnecting structures in accordance with some alternative embodiments.

FIG. 3 illustrates a perspective-sectional view of an example three-layer structure of a horizontal connecting structure. The horizontal connecting structure can be used as either the first horizontal connecting structure 208 or the second horizontal connecting structure 230 in FIG. 2. In the example, a first conductive layer 320 is a first vertical connection element electrically coupled to a device of a device tier thereunder. A second conductive layer 322 is a first horizontal layer disposed above the first vertical connection element 320 and a third conductive layer 324 is a second horizontal layer disposed above the first horizontal layer 322 and electrically coupled to a device on a substrate 304 of a device tier 326 thereon through both the first conductive layer 320 and the second conductive layer 322. A location of at least a portion of the first conductive layer 320 shifts horizontally to a location of the second conductive layer 322 or the third conductive layer 324. The first conductive layer 320 connects contact points such as 326 and 328 on the other side of a substrate 304 not vertically aligned with a location of the first conductive layer 320 through the second conductive layer 322 and the third conductive layer 324. The first conductive layer 320, which is a vertical connection element in the illustrated example, can have a square-like or rounded perimeter as viewed from above and can fall within edges of second conductive layer. In some embodiments, 320 is formed along Z direction, 322 is formed along Y direction, 324 is formed along X direction. In some embodiments, 320, 322, 324 are in perpendicular with each other in respective X, Y, Z direction. In some embodiments, 304 includes any number of conductive layers. In some embodiments, any two conductive layers of the conductive layers in 304 are in parallel or in perpendicular with each other.

Figure 4:
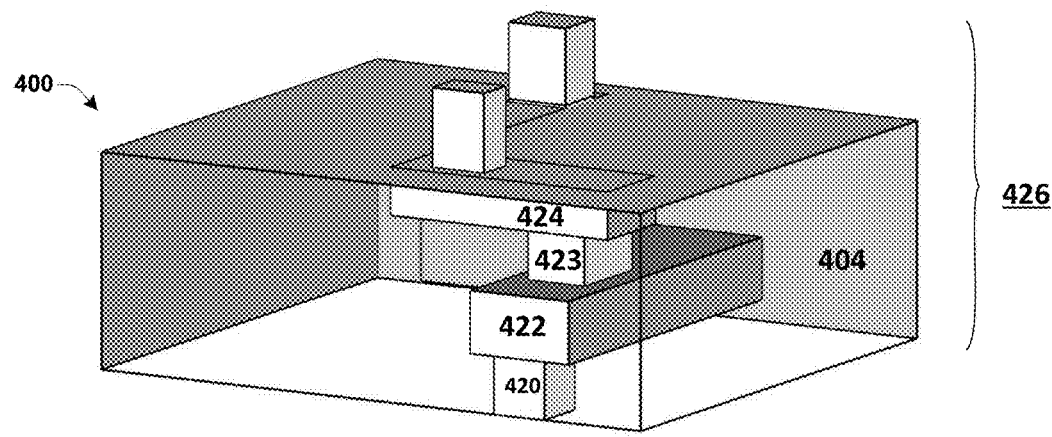

FIG. 4 illustrates a perspective-sectional view of a four-layer horizontal connecting structure 400 comprising an additional fourth conductive layer. The four layer horizontal connecting structure 400 can be used as either the first horizontal connecting structure 208 or the second horizontal connecting structure 230 in FIG. 2. In FIG. 4's example, a first conductive layer 420 is a first vertical connection element extending in the z-direction and which is electrically coupled to a device of a device tier (not shown) thereunder. A second conductive layer 422 is a first horizontal layer disposed above the first vertical connection element 420 and extending in the y-direction. A third conductive layer 423 is a second vertical connection element connecting the second conductive layer 422 to a fourth conductive layer 424. The fourth conductive layer 424 is a second horizontal layer which extends in the x direction and which is disposed above the second vertical connection element 423. The first conductive layer 420 is electrically coupled to a device on a substrate 404 of device tier 426 through the second conductive layer 422, the third conductive layer 423, and the fourth conductive layer 424. Structures of FIG. 3 and FIG. 4 can be applied to any upper level tier (e.g. the tier 102 of 100 and tier 202 or 226 of 200) of disclosed stacked CMOS devices.

Figure 5:
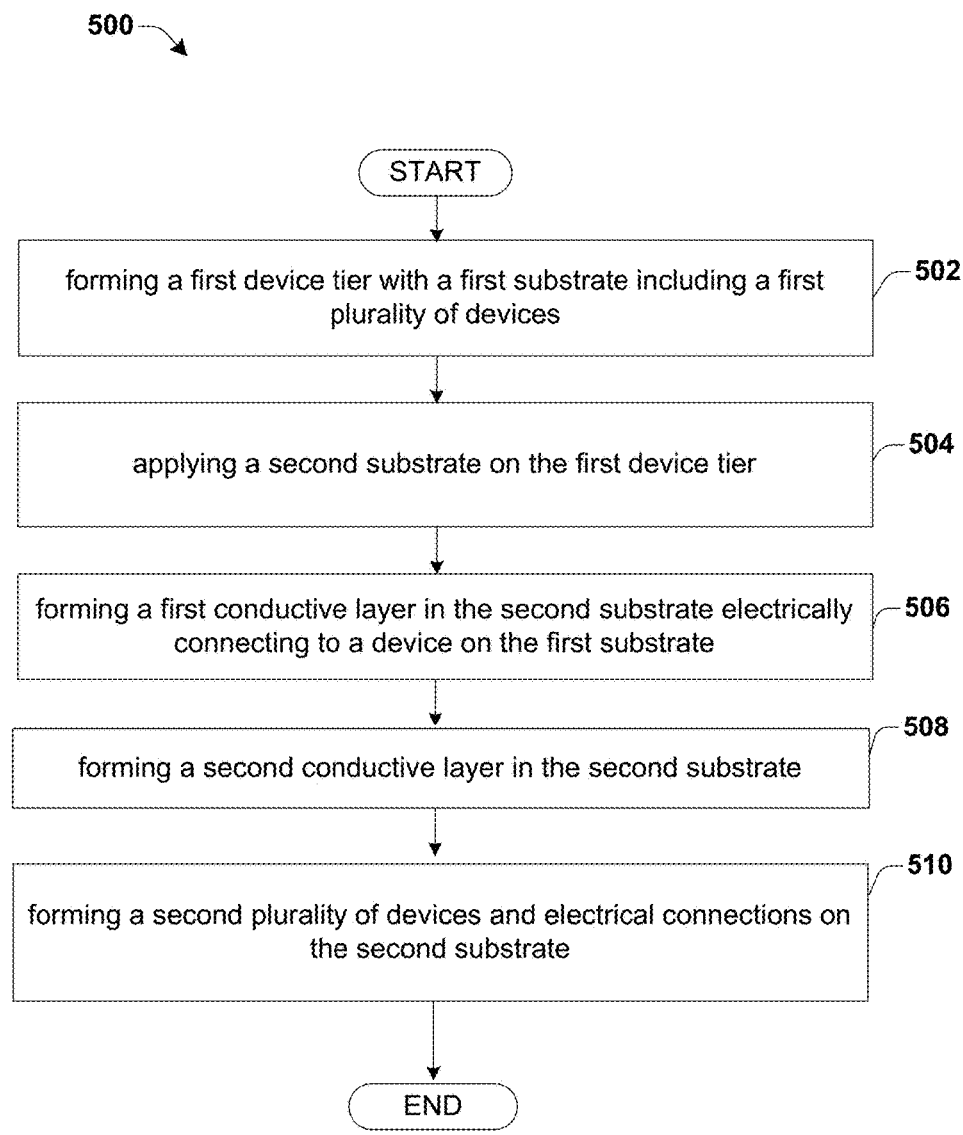
FIG. 5 illustrates a flow diagram of some embodiments of methods for connecting stacked CMOS devices.

FIG. 5 illustrates a flow diagram of some embodiments of methods for connecting stacked CMOS tiers in accordance with some embodiments. While disclosed methods (e.g., methods 500 of FIG. 5) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, a first device tier with a first substrate including a first plurality of devices is formed.

At 504, a second substrate is applied on the first device tier.

At 506, a first conductive layer is formed in the second substrate electrically connecting to a device on the first substrate.

At 508, a second conductive layer is formed in the second substrate.

At 510, a second plurality of devices and electrical connections are formed on the second substrate.

One example of FIG. 5's method is now described with regards to a series of cross-sectional views as shown in FIGS. 6a-6e. Although 6a-6e are described in relation to method 500, it will be appreciated that the structures disclosed in FIGS. 6a-6e are not limited to such a method, but instead may stand alone as a structure.

Figure 6A:
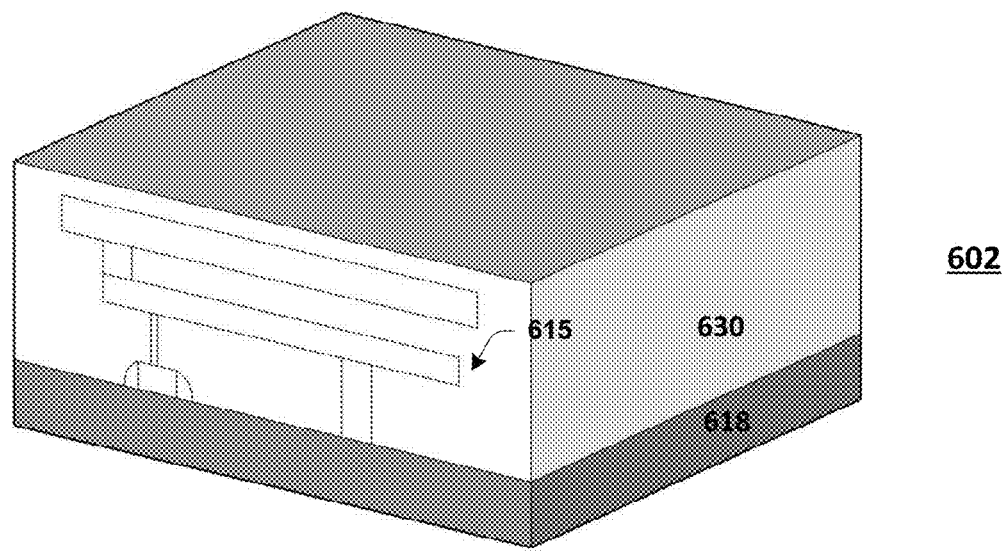
FIGS. 6A-6E illustrate perspective-sectional views of some embodiments of methods for connecting stacked CMOS devices.

At FIG. 6a, a first device tier 602 with a first substrate 618 and a first plurality of devices is formed. An electrical path 615 with multiple layers of metal is formed onto the first substrate inside a dielectric layer 630. The multiple layers of metal can be copper, silver, tungsten or aluminum, for example.

Figure 6B:
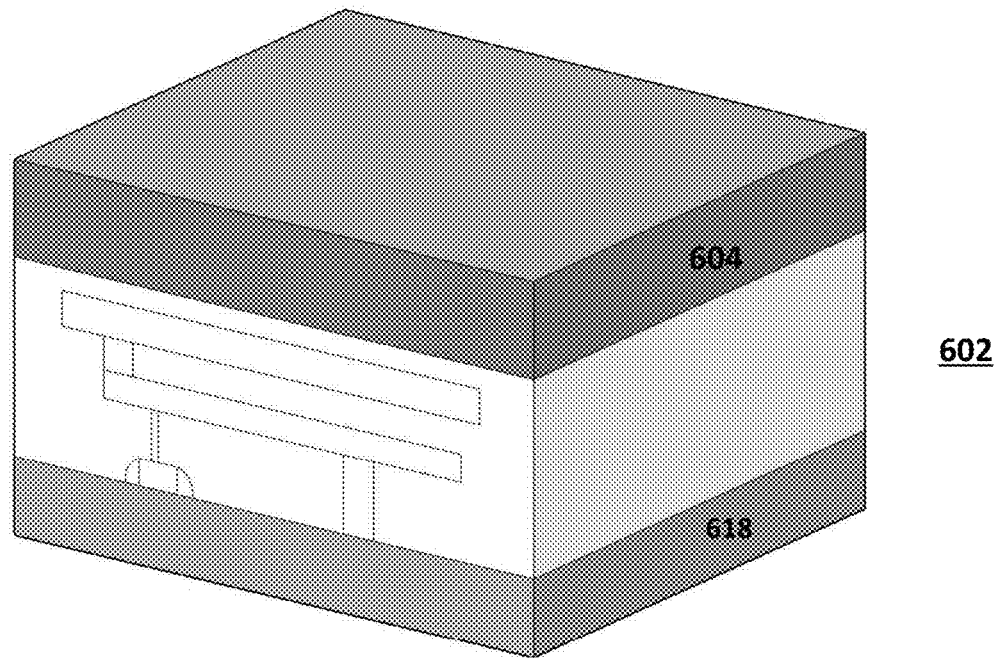

At FIG. 6b, a second substrate 604 is applied on the first device tier 602. The second substrate can be formed by deposition, such as epitaxial deposition for example, or can be bonded to the second device tier 116. For example, in some embodiments, the first device tier can correspond to a first bulk silicon wafer, and the second device tier can correspond to a second bulk silicon wafer, wherein the first wafer has a backside (or topside) that is bonded to the topside of the second bulk silicon wafer.

Figure 6C:
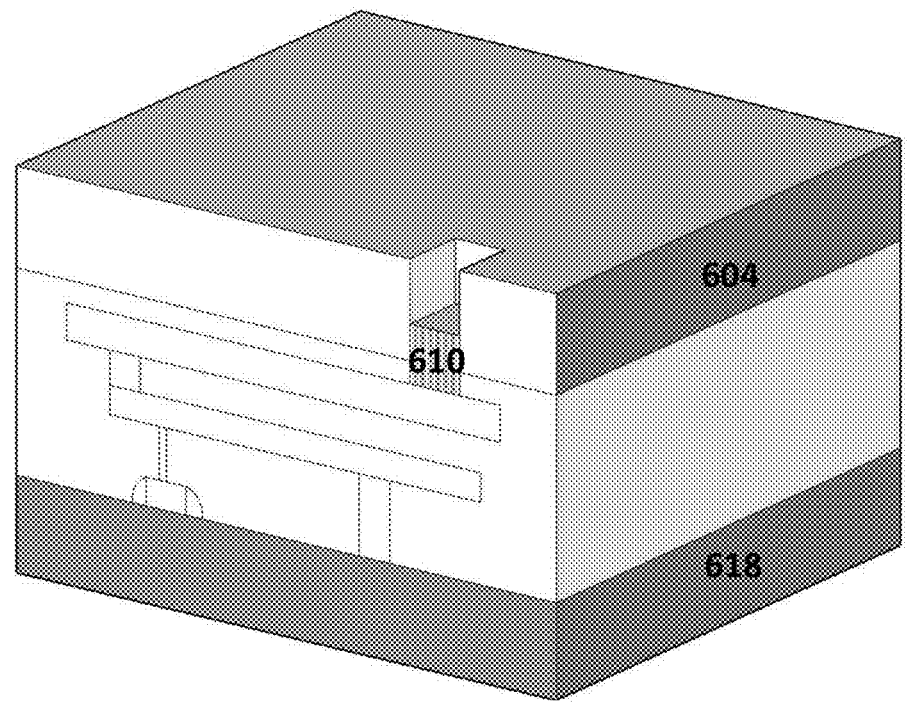

At FIG. 6c, after the second substrate has been applied to the first substrate, a first conductive layer 610 is formed in the second substrate. The first conductive layer 610 electrically connecting to a device on the first substrate 618. For example, the first conductive layer 610 can be copper, silver, tungsten or aluminum with a Ta, Ti, TaN, TiW, TiWN or TiN barrier (not shown) for preventing metal diffusions. A dielectric layer (not shown) is formed surrounding the barrier layer for electrical isolations.

Figure 6D:
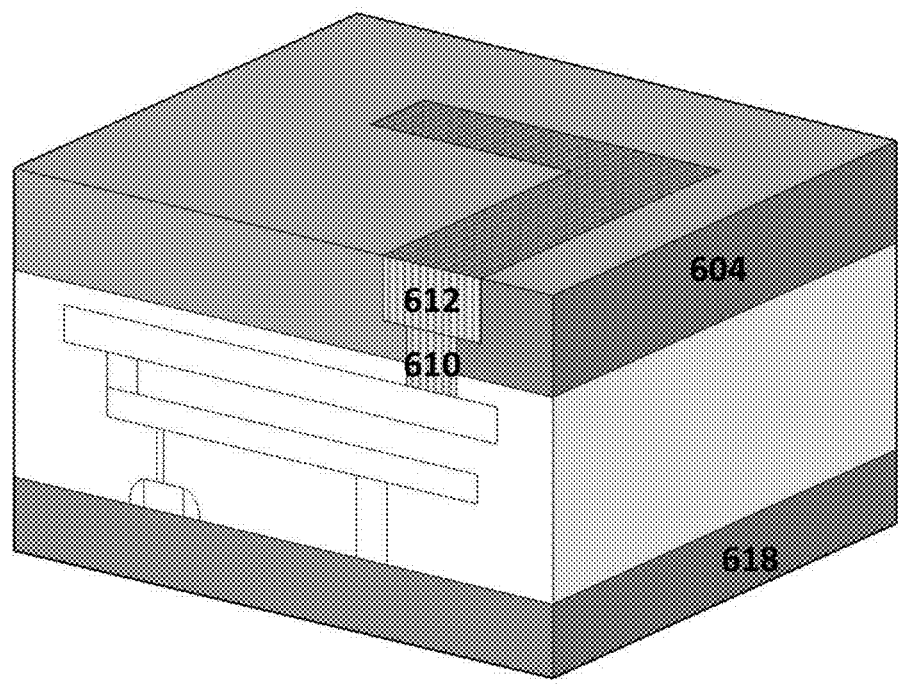

At FIG. 6d, a second conductive layer 612 is formed in the second substrate 604. For example, the second conductive layer 612 can be copper, silver, tungsten or aluminum with Ta, Ti, TaN, TiW, TiWN or TiN barrier for preventing metal diffusion, and also form dielectric layer surrounding the barrier layer for electrical isolation.

Figure 6E:
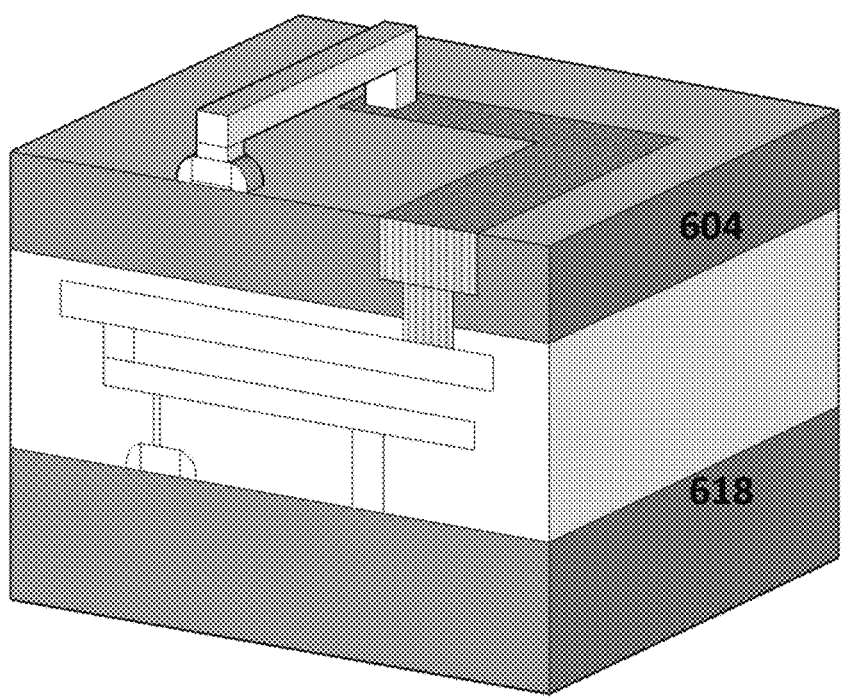

At FIG. 6e, a second plurality of devices and electrical connections are formed on the second substrate. One or more of the second plurality of devices on the second substrate are electrically coupled to one or more of the first plurality of devices on the first substrate.

Thus, the present disclosure relates to an integrated chip having an inter-tier interconnecting structure with horizontal components, which is arranged within a semiconductor substrate and that is configured to electrically couple a first device tier to a second device tier.

In some embodiments, the disclosure relates to an integrated circuit. The integrated chip comprises a first device tier having a first semiconductor substrate. A first inter-tier interconnecting structure is disposed inside the first semiconductor substrate and comprises a first segment extending in a first direction and a second segment protruding outward from a sidewall of the first segment in a second direction substantially perpendicular to the first direction. A second device tier is electrically coupled to the first device tier by the first inter-tier interconnecting structure.

In other embodiments, the disclosure relates to an integrated circuit. The integrated chip comprises a first device tier having a first semiconductor substrate. An inter-tier interconnecting structure is disposed within the first semiconductor substrate. The inter-tier interconnect structure comprises a first connection point at a lower surface of the inter-tier interconnecting structure and a second connection point at an upper surface of the inter-tier interconnecting structure. The first connection point and the second connection point are not vertically aligned. The inter-tier interconnecting structure comprises one or more conductive layers extending between the first and second connection points.

In yet other embodiments, the disclosure relates to an integrated circuit. The integrated chip comprises a first device tier having a first inter-tier interconnecting structure arranged inside a first semiconductor substrate. The first inter-tier interconnecting structure comprises a first conductive layer and a second conductive layer with different patterns. A second device tier is electrically connected to the first device tier by the first inter-tier interconnecting structure.

It will be appreciated that while reference is made throughout this document to exemplary structures in discussing aspects of methodologies described herein (e.g., the structure presented in FIGS. 6a-6e, while discussing the methodology set forth in FIG. 5), that those methodologies are not to be limited by the corresponding structures presented. Rather, the methodologies (and structures) are to be considered independent of one another and able to stand alone and be practiced without regard to any of the particular aspects depicted in the Figs. Additionally, layers described herein, can be formed in any suitable manner, such as with spin on, sputtering, growth and/or deposition techniques, etc.

Also, equivalent alterations and/or modifications may occur to those skilled in the art based upon a reading and/or understanding of the specification and annexed drawings. The disclosure herein includes all such modifications and alterations and is generally not intended to be limited thereby. For example, although the figures provided herein, are illustrated and described to have a particular doping type, it will be appreciated that alternative doping types may be utilized as will be appreciated by one of ordinary skill in the art.

In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

What is claimed is:

1. An integrated circuit (IC), comprising:
   a first device tier comprising a first semiconductor substrate;
   a first inter-tier interconnecting structure disposed inside the first semiconductor substrate and comprising a first segment extending in a first direction and a second segment protruding outward from a sidewall of the first segment in a second direction substantially perpendicular to the first direction; and
   a second device tier electrically coupled to the first device tier by the first inter-tier interconnecting structure.

2. The IC of claim 1, further comprising:
   a first dielectric layer disposed on a surface of the first semiconductor substrate facing away from the second device tier, wherein a first plurality of metal layers are surrounded by the first dielectric layer and are coupled to the first inter-tier interconnecting structure at a first position.

3. The IC of claim 2, wherein the second device tier comprises a second dielectric layer disposed between the first semiconductor substrate and a second semiconductor substrate, wherein a second plurality of metal layers are disposed within the second dielectric layer and are coupled to the first inter-tier interconnecting structure at a second position laterally offset from the first position.

4. The IC of claim 1, wherein the first inter-tier interconnecting structure comprises a first conductive layer and a second conductive layer disposed on the first conductive layer with a different pattern than the first conductive layer.

5. The IC of claim 1, wherein the first inter-tier interconnecting structure comprises silver or tungsten.

6. The IC of claim 1, further comprising:
a dielectric layer laterally separating the first inter-tier interconnecting structure from the first semiconductor substrate; and
a barrier layer arranged between the first inter-tier interconnecting structure and the dielectric layer, wherein the barrier layer is configured to prevent diffusion between the dielectric layer and the first inter-tier interconnecting structure.

7. The IC of claim 1, wherein the first inter-tier interconnecting structure comprises:
a first conductive layer comprising a first vertical connection element electrically coupled to a device within the second device tier;
a second conductive layer comprising a first horizontal layer disposed above the first vertical connection element; and
a third conductive layer comprising a second horizontal layer disposed above the first horizontal layer and electrically coupled to a device within the first device tier.

8. The IC of claim 7, wherein the second conductive layer and the third conductive layer are perpendicular to each other.

9. The IC of claim 1, further comprising:
a third device tier stacked onto the first device tier, wherein the third device tier comprises a third semiconductor substrate; and
a second inter-tier interconnecting structure arranged inside the third semiconductor substrate and configured to electrical connect a device within the first device tier and a device within the third device tier.

10. The IC of claim 9, wherein the first inter-tier interconnecting structure and the second inter-tier interconnecting structure respectively comprise a plurality of conductive layers with different footprints.

11. The IC of claim 10, wherein the second inter-tier interconnecting structure has a different numbers of conductive layers than the first inter-tier interconnecting structure.

12. An integrated circuit (IC), comprising:
a first device tier comprising a first semiconductor substrate;
an inter-tier interconnecting structure disposed within the first semiconductor substrate and comprising a first connection point at a lower surface of the inter-tier interconnecting structure and a second connection point at an upper surface of the inter-tier interconnecting structure, wherein the inter-tier interconnecting structure comprises one or more conductive layers extending between the first and second connection points and wherein the first connection point and the second connection point are not vertically aligned; and
a second device tier electrically coupled to the first device tier by the inter-tier interconnecting structure.

13. The IC of claim 12, wherein the second device tier is arranged below the first device tier and comprises a second device disposed over a second semiconductor substrate, wherein the second device is electrically connected to a first device within the first device tier by way of the inter-tier interconnecting structure.

14. The IC of claim 12, wherein the inter-tier interconnecting structure comprises a first conductive layer and a second conductive layer, wherein the first conductive layer and the second conductive layer have different patterns as viewed from above the first semiconductor substrate.

15. The IC of claim 12, wherein the inter-tier interconnecting structure comprises a first segment extending in a first direction and a second segment protruding outward from a sidewall of the first segment in a second direction substantially perpendicular to the first direction.

16. The IC of claim 12, wherein the first semiconductor substrate is a silicon substrate.

17. The IC of claim 12, wherein the first semiconductor substrate is a bulk silicon substrate.

18. An integrated circuit (IC), comprising:
a first device tier comprising a first semiconductor substrate;
a first inter-tier interconnecting structure arranged inside the first semiconductor substrate, wherein the first inter-tier interconnecting structure comprises a first conductive layer and a second conductive layer with different patterns; and
a second device tier electrically connected to the first device tier by the first inter-tier interconnecting structure.

19. The IC of claim 18, wherein the first inter-tier interconnecting structure comprises:
a first vertical connection element disposed in the first semiconductor substrate; and
a first horizontal connection element disposed in the first semiconductor substrate above the first vertical connection element.

20. The IC of claim 18, wherein the first semiconductor substrate is a silicon substrate.

* * * * *